(12) United States Patent
Kawasaki et al.

(10) Patent No.: US 7,262,600 B2
(45) Date of Patent: Aug. 28, 2007

(54) NMR PROBE

(75) Inventors: Kenji Kawasaki, Hitachi (JP); Minseok Park, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/483,594

(22) Filed: Jul. 11, 2006

(65) Prior Publication Data

US 2007/0007963 A1    Jan. 11, 2007

(30) Foreign Application Priority Data

Jul. 11, 2005    (JP) .............................. 2005-201733

(51) Int. Cl.
    *G01V 3/00*    (2006.01)
(52) U.S. Cl. ...................... 324/321; 324/318
(58) Field of Classification Search ................ 324/321, 324/318
    See application file for complete search history.

(56) References Cited

U.S. PATENT DOCUMENTS

| | | | |
|---|---|---|---|
| 6,329,820 B1* | 12/2001 | Hasegawa et al. | 324/315 |
| 6,466,019 B2* | 10/2002 | Marek | 324/318 |
| 6,914,430 B2* | 7/2005 | Hasegawa et al. | 324/315 |
| 2001/0015646 A1* | 8/2001 | Marek | 324/321 |
| 2004/0004478 A1* | 1/2004 | Hofmann et al. | 324/321 |

FOREIGN PATENT DOCUMENTS

| | | |
|---|---|---|
| JP | 2001-242229 | 9/2001 |
| JP | 2002-168932 | 6/2002 |
| JP | 2002-196056 | 7/2002 |

* cited by examiner

*Primary Examiner*—Brij Shrivastav
*Assistant Examiner*—Megann E. Vaughn
(74) *Attorney, Agent, or Firm*—Antonelli, Terry, Stout & Kraus, LLP.

(57) ABSTRACT

The invention reduces a flow of a heat making an intrusion into an NMR probe, and uniformizes a spatial temperature generated in a sample pipe. A temperature modulated gas is supplied to a thermal anchor temperature modulated gas flow path constituted by a sample pipe insertion port around a sample pipe, and sample pipe insertion port structure bodies. A part of the temperature modulated gas is divided into a thermal anchor temperature modulated gas flow path by a temperature modulated gas division hole, and flows toward a thermal anchor. The thermal anchor is constituted by a porous member having a hole through which a gas can pass, and comes to the same temperature as the temperature modulated gas on the basis of a heat exchange with the temperature modulated gas. Further, since the thermal anchor is provided in a path of a heat flow making an intrusion into the sample pipe from an external portion, it is possible to absorb the heat intruding from the external portion by the temperature modulated gas passing through the thermal anchor, and it is possible to stably keep the temperature of the sample pipe.

8 Claims, 4 Drawing Sheets

SUPER CONDUCTING MAGNET

SAMPLE SOLUTION

ROOM TEMPERATURE SHIM COIL

NMR PROBE

BACKGROUND OF THE INVENTION

1. Field of the Invention

The present invention relates to an NMR probe for executing an NMR measurement, and relates to a probe structure spatially uniformizing temperatures of a sample pipe and a sample solution.

2. Description of Related Art

Since an unevenness of a temperature of a sample pipe causes a disarrangement of an NMR signal, it is necessary to execute a temperature control for making the temperature of the sample pipe spatially uniform, and it is required to control a temperature of a portion close to the sample pipe accordingly. "Unevenness of temperature" in this case means a cause disarranging the NMR signal, and is synonymous with "temperature gradient" described in patent documents 1 to 3 JP-A-2002-196056, JP-A-2002-168932 and JP-A-2001-242229.

Most of NMR probes are provided with a vacuum heat insulating pipe covering an entire of the sample pipe in a position close to the sample pipe, thereby reducing a heat making an intrusion into the sample pipe from a probe case so as to satisfy the requirement mentioned above.

However, in the NMR probe having a specification that the sample pipe is inserted perpendicularly to an inserting direction to a magnetic bore, the vacuum heat insulating pipe becomes structurally shorter, and does not satisfy the requirement mentioned above. Further, the NMR probe which can not be provided with the vacuum heat insulating pipe due to a special-purpose specification does not satisfy the requirement mentioned above. Further, in the NMR probe requiring a higher temperature control, the requirement mentioned above can not be satisfied only by the provision of the vacuum heat insulation. Accordingly, it becomes a problem to uniformize the spatial temperature of the NMR probe in which the requirement can not be satisfied only by the provision of the vacuum heat insulating pipe, or in which the vacuum heat insulating pipe itself can not be provided.

BRIEF SUMMARY OF THE INVENTION

An object of the present invention is to provide an NMR probe spatially uniformizing a temperature of a sample pipe by reducing a heat intrusion from a probe case.

MEANS FOR SOLVING THE PROBLEM

In order to achieve the object mentioned above, in accordance with the present invention, there is provided an NMR probe in which in a heat intruding path, there is arranged a thermal anchor kept at the same temperature as a temperature controlled gas flow by being heat exchanged through the temperature controlled gas flow, for reducing a heat making an intrusion into the sample pipe from the probe case or the like.

More specifically, there is provided an NMR probe comprising:

a probe case inserted to a bore portion of a superconducting magnet;

a sample pipe insertion port surrounded by the probe case and provided for inserting a sample pipe thereto;

a probe coil receiving a nuclear magnetic resonance (NMR) signal of a sample entering into the sample pipe, the probe coil being provided in an outer side near the center of the sample pipe insertion port; and a temperature modulated gas for controlling a temperature of the sample pipe capable of being supplied to the sample pipe insertion port, wherein a sample pipe insertion structure body constituted by a hollow portion and double pipes is provided in an inner side of the probe case, the sample pipe insertion port is formed by the hollow portion, the temperature modulated gas is supplied to a flow path between the double pipes, and the NMR probe is provided with a thermal anchor exchanging heat with the temperature modulated gas flowing through the flow path and connecting the probe case and the sample pipe insertion structure body.

In this case, a description will be given of the thermal anchor. The thermal anchor corresponds to a porous member through which the temperature modulated gas can pass. A structure body forming the thermal anchor is nonmagnetic, and a ratio between a volume and a surface area of the thermal anchor is equal to or more than 10 $cm^2/cm^3$. For example, a sintered metal having holes through which the temperature modulated gas passes, a foam metal and the like can be employed. Since the porous member has a wide surface area structurally, the porous member improves a heat exchanging effectiveness between the temperature modulated gas and the thermal anchor. In other words, since the thermal anchor executes a heat exchanging operation with the temperature modulated gas, and comes to the same temperature as that of the temperature modulated gas, the thermal anchor suppresses a heat intrusion from the probe case. At the same time, the thermal anchor constitutes a support body, and connects the probe case and the sample pipe insertion structure body in an upper portion and a lower portion so as to support the probe.

EFFECT OF THE INVENTION

The NMR probe in accordance with the present invention uses the thermal anchor in the heat intruding path to the sample pipe causing the temperature unevenness, and can arrange it even in a narrow space where the vacuum heat insulating pipe can not be arranged due to a spatial restriction. Since the thermal anchor functions by flowing the temperature modulated gas for regulating the temperature of the sample pipe, the thermal anchor does not generate a disarrangement of a static magnetic field and an electric noise as is different from an electric heater.

Other objects, features and advantages of the invention will become apparent from the following description of the embodiments of the invention taken in conjunction with the accompanying drawings.

DETAILED DESCRIPTION OF THE INVENTION

An NMR probe in accordance with the present embodiment has a probe case inserted to a bore portion of a superconducting magnet, and a sample pipe insertion port surrounded by the probe case and provided for inserting a sample pipe thereto, and is provided with a probe coil receiving a nuclear magnetic resonance (NMR) signal of a sample entering into the sample pipe, in an outer side near the center of the sample pipe insertion port. Further, the structure is made such that a temperature modulated gas for controlling a temperature of the sample pipe capable can be supplied to the sample pipe insertion port. Further, the structure is made such that a sample pipe insertion structure body constituted by a hollow portion and double pipes is provided in an inner side of the probe case, the sample pipe insertion port is formed by the hollow portion, and the temperature modulated gas can be supplied to a flow path between the double pipes. Further, the NMR probe is provided with a thermal anchor exchanging heat with the temperature modulated gas flowing through the flow path and connecting the probe case and the sample pipe insertion structure body.

In other words, since the thermal anchor is arranged in the path of the heat making an intrusion into the sample pipe, and the thermal anchor is arranged so as to have the same temperature as the temperature modulated gas flow on the basis of the heat exchange with the temperature modulated gas flow, the heat intrusion is suppressed, and it is possible to uniformize the temperature of the sample pipe. The thermal anchor is constituted by the porous metal or the porous ceramics.

A flow division hole of the temperature modulated gas is provided in the sample pipe insertion structure body. The flow division hole is provided near a lower end of the sample pipe insertion port.

Further, the temperature modulated gas is supplied from a lower side of the sample pipe insertion port or the flow path side of the sample pipe insertion structure body. Alternatively, the temperature modulated gas is supplied from both of the lower side of the sample pipe insertion port and the flow path side of the sample pipe insertion structure body.

EMBODIMENT 1

Figure 2:
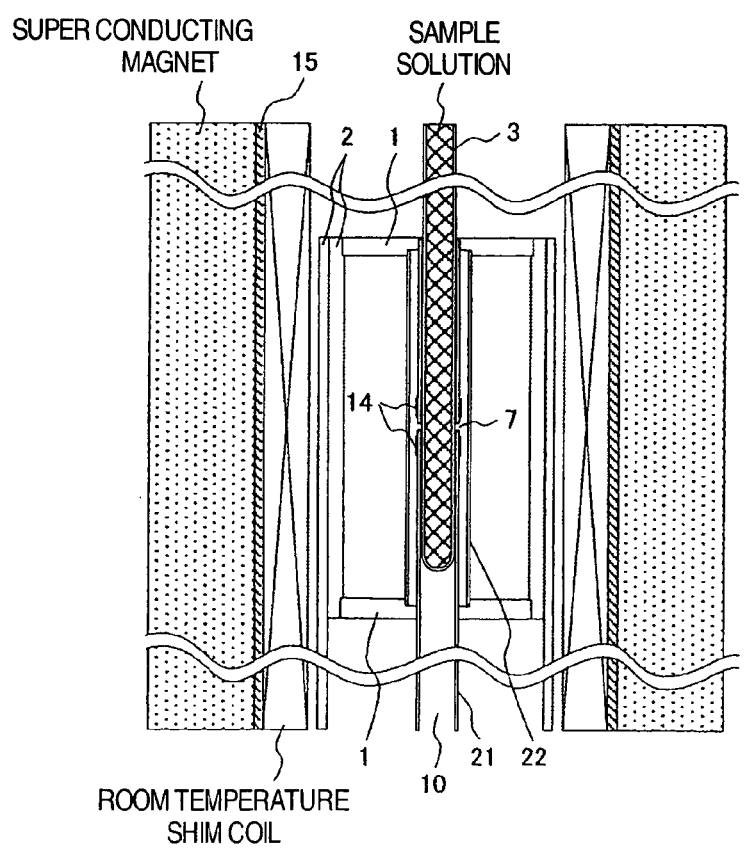
FIG. 2 is a cross sectional view of the NMR probe installed within a superconducting magnet.

FIG. 2 shows a cross sectional view of an NMR probe installed within a superconducting magnet. The NMR probe is inserted to a superconducting magnet bore 15, and a sample pipe 3 is inserted into a sample pipe insertion port 10 formed by a probe case 2, a thermal anchor 1 and sample pipe insertion port structure bodies 21 and 22. the NMR probe is formed in a rotation symmetrical shape having a straight line penetrating up and down sides of the center in FIG. 2 as a base axis. Two thermal anchors 1 are used. A direction of a main magnetic field formed by the superconducting magnet corresponds to a direction from an upper side to a lower side on a paper surface.

Figure 3:
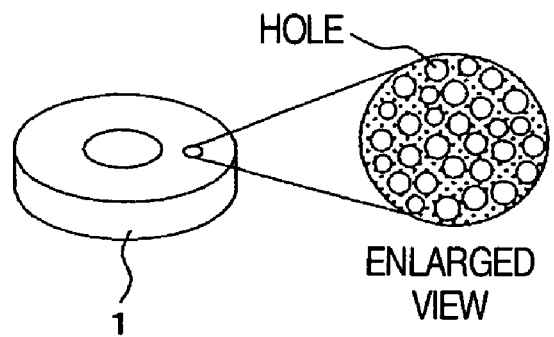
FIG. 3 is an explanatory view showing a shape of a thermal anchor.

FIG. 3 shows a shape of the thermal anchor shown in the embodiment 1. The thermal anchor 1 is formed in a disc shape and is of a so-called compact disc type in which a hole is formed in the center. As shown in an enlarge view of a part of the thermal anchor 1, the thermal anchor is constituted by a porous member having a hole through which a gas can pass. A material of the thermal anchor 1 can employ, for example, a porous metal represented by a sintered metal or a foam metal, or a porous ceramics. Further, it is desirable that a material of the thermal anchor employs a material in which an absolute value of a magnetic susceptibility is equal to or less than $1 \times 10^{-6}$ cgs unit (weight magnetic susceptibility).

A source of a heat flow flowing to the sample pipe 3 is constituted by a joule heat generated at a time of circulating a current in a room temperature shim coil shown in FIG. 2. The room temperature shim coil corresponds to a magnet for generating a magnetic field canceling an irregular magnetic field generated due to the probe or an inner wall of the superconducting magnet bore, and a wire rod of the coil is made of a copper.

A probe coil 14 is provided for receiving an NMR signal generated by a sample solution within the sample pipe 3, and is wound around a sample pipe insertion port structure body 21 as a bobbin. Temperature modulated gas flow division holes 7 are provided at four positions in a side surface of the vertical center of the sample pipe insertion port structure body 21 at an interval of 90 degree. For example, the flow division hole 7 has a circular shape having a diameter of about 1 mm.

In a typical example of the NMR probe, a component of the sample pipe 3 is constituted by a silica glass, a dimension thereof is constituted by an outer diameter of 5 mm, an inner diameter of 4 mm and a length of 180 mm. The sample pipe insertion port structure body 21 is formed in a tubular shape, and is constituted, for example, by a glass pipe having an outer diameter of 6.4 mm and an inner diameter of 5.6 mm. A shortest distance between the probe coil 14 and the probe case 2 is about 11 mm. Further, a distance between the thermal anchors 1 arranged in the upper and lower sides of the probe coil 14 is 44 mm. In the above description, since the inner diameter of the sample pipe insertion port 10 is set to 5.6 mm, an interval of a gap formed in a side surface of the sample pipe 3 inserted to the sample pipe insertion port 10 comes to 0.3 mm. The temperature modulated gas 5 circulates in the annular gap, thereby exchanging heat with the sample pipe 3.

Figure 1:
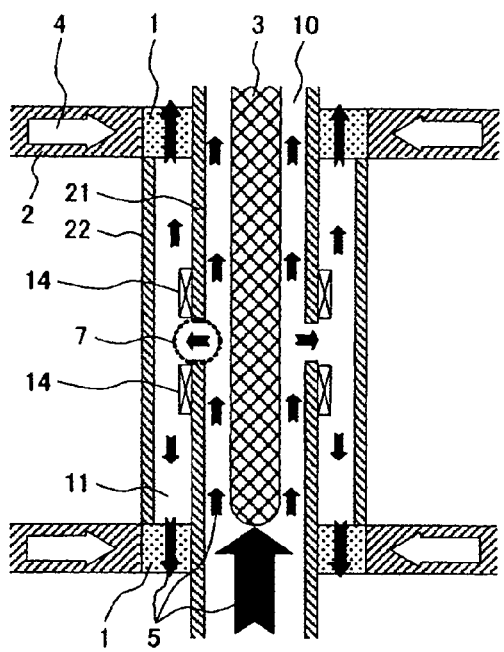
FIG. 1 is a schematic view of an NMR probe reducing a heat intrusion into a sample pipe in accordance with an embodiment 1.

FIG. 1 shows a skeleton structure of the NMR probe in accordance with the embodiment 1 of the present invention. The sample pipe 3 is inserted to the sample pipe insertion port 10. The NMR signal generated by the sample pipe 3 is received by the probe coil 14. The probe coil 14 is arranged so as to be as close as possible to the sample pipe 3, and is arranged in a place which is away from the probe case 2. In FIG. 1, the probe coil 14 is provided in the middle of the upper and lower probe cases 2.

A characteristic structure of the present probe in comparison with the general NMR probe exists in a point that the thermal anchor 1 is provided between the probe case 2 and the sample pipe insertion port structure body 8. Further, it exists in a point that the thermal anchor 1 is provided with a thermal anchor temperature modulated gas flow path 11 for circulating the temperature modulated gas flow 5. A component of the temperature modulated gas 5 is constituted by an inert gas such as a nitrogen, a helium, a neon, an argon and the like, or an active gas such as an oxygen, an air and the like.

The temperature modulated gas 5 is first supplied from a lower side of the sample pipe insertion port 10, and exchanges heat with the sample pipe 3. The temperature modulated gas 5 is branched by the temperature gas flow division hole 7 provided in the sample insertion port structure body 21 existing near the center of the sample insertion port 10. A part of the temperature modulated gas 5 exchanges heat with the sample pipe 3 as it is, and flows to an upper side. The remaining part of the temperature modulated gas 5 flows toward the thermal anchor 1 through the thermal anchor temperature modulated gas flow path 11 provided in an outer side of the sample pipe insertion port 10. At this time, the thermal anchor 1 exchanges heat with the temperature modulated gas 5, and keeps the temperature constant.

The temperature modulated gas 5 originally corresponds to a gas circulated for setting the temperature of the sample pipe to an optional value and spatially uniformizing the temperature. For example, in the case that the temperature modulated gas is supplied from the lower side of the sample pipe insertion port 10 at a flow rate of 10 liter per minute, it is desirable to set a flow rate of the temperature modulated gas 5 discharged from the upper portion of the sample pipe insertion port 10, and a flow rate of the temperature modulated gas 5 divided into the thermal anchor temperature modulated gas flow path 11 by the temperature modulated gas flow division hole 7, to 5 liter per minute respectively.

In order to uniformly divide the temperature modulated gas, it is preferable to equalize a pressure loss of the temperature modulated gas flowing through each of the flow paths. A consideration for equalizing the pressure loss first calculates the pressure loss generated at a time when the temperature modulated gas 5 which flows out to the upper portion of the sample insertion port 10 without being divided by the temperature modulated gas flow division hole 7 flows at 5 liter per minute. It can be calculated in accordance with a model circulating a nitrogen gas in an annular pipe. Since Reynolds number becomes equal to or less than 2000 so as to form a laminar flow region, a result of calculation is about 600 Pa. On the other hand, most of the total pressure loss generated in the temperature modulated gas 5 flowing to the upper and lower thermal anchors 5 by the temperature modulated gas flow division hole 7 is determined on the basis of a dimension of the thermal anchor, and a magnitude and a density of the hole. Accordingly, in order to set the flow rate of the temperature modulated gas divided into the sample pipe insertion port 10 and the thermal anchor 5 by the temperature modulated gas flow division hole to one-to-one 5 liter per minute, it is preferable to set the pressure loss generated in the thermal anchor 5 to about 600 Pa by regulating the dimension of the thermal anchor, and the magnitude, the density and the like of the hole.

Since the temperature modulated gas 5 flows in the flow path mentioned above, the thermal anchor 1 exchanges heat with the temperature modulated gas 5 and comes to the same temperature as the temperature modulated gas 5. Further, the thermal anchor 1 exchanging heat with the temperature modulated gas 5 further carries out a function of reducing a heat flow 4 which is going to make an intrusion into the sample pipe 3 from the probe case 2.

EMBODIMENT 2

Figure 4:
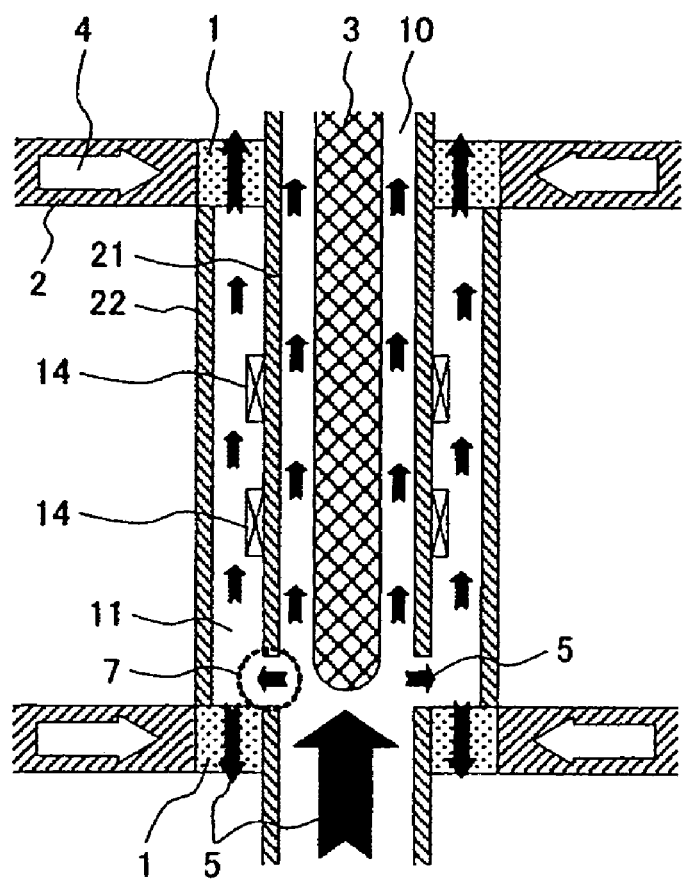
FIG. 4 is a schematic view of an NMR probe in accordance with an embodiment 2.

FIG. 4 is a schematic view showing a flow path and a heat flow intruding from a probe case in the case of circulating the temperature modulated gas in a probe in accordance with an embodiment 2. A basic flow of the temperature modulated gas 5 is the same as the embodiment 1, however, the temperature modulated gas 5 has one different point. In other words, a position at which the temperature modulated gas 5 for making the thermal anchor 1 function is divided is set to the lower portion of the sample pipe 3, and the heat control gas 5 before exchanging heat with the sample pipe 3 flows toward the thermal anchor 1.

In the embodiment 2, the temperature modulated gas division hole 7 is positioned at a position which is away from the probe coil 14. A material of the sample pipe insertion port structure body 8 is constituted by a silica glass. In the case that the temperature modulated gas flow division hole 7 is provided in the material mentioned above, a disarrangement of the magnetic field is generated near the temperature modulated gas flow division hole 7. In the present embodiment, since the disarrangement of the magnetic field by the temperature modulated gas flow division hole 7 is not generated near the probe coil 14, there is an effect that it is not necessary to consider the disarrangement of the magnetic field. This matter provides an advantage that it is more freely determine the magnitude and the shape of the temperature modulated gas flow division hole 7 in comparison with the case of the embodiment 1.

EMBODIMENT 3

Figure 5:
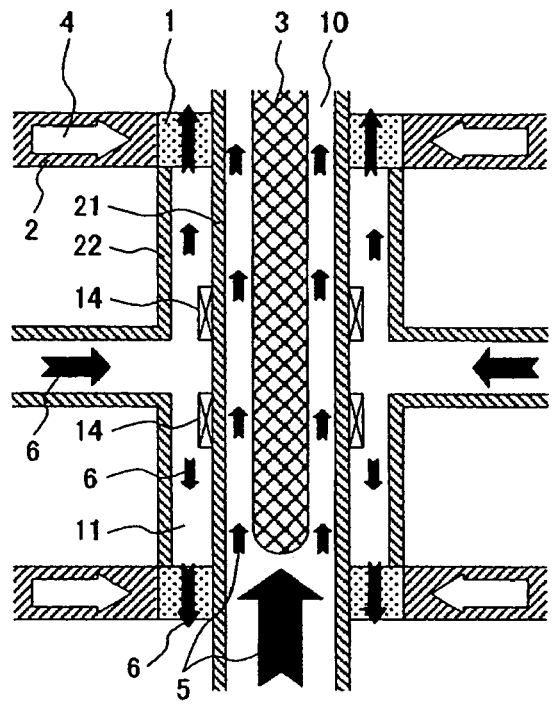
FIG. 5 is a schematic view of an NMR probe in accordance with an embodiment 3.

FIG. 5 is a schematic view showing a flow path and a heat flow intruding from a probe case in the case of circulating the temperature modulated gas in a probe in accordance with an embodiment 3. In the embodiment 3, a temperature modulated gas 6 is supplied from a different system in addition to the temperature modulated gas 5. The temperature modulated gas 5 flowing in the outer side of the sample pipe 3, and the temperature modulated gas 6 passing through the thermal anchor 1 are respectively independently controlled, and make the temperatures of the sample pipe 3 and the thermal anchor 1 identical. The components of the temperature modulated gas 5 and the temperature modulated gas 6 may be different from each other.

In accordance with this structure, even in the case that the heat flow 4 from the probe case 2 is much, it is possible to keep the temperature of the sample pipe 3 spatially uniform by increasing only a flow rate of the temperature modulated gas 6 circulating to the thermal anchor 1, or circulating the temperature modulated gas 6 having a lower temperature.

Further, in the embodiment 3, even in the case that the temperature modulated gas 5 circulating to the sample pipe 3 can not be used, it is possible to regulate the temperature of the sample pipe 3 on the basis of a radiant heat generated from the sample pipe insertion port structure body 8.

EMBODIMENT 4

Figure 6:
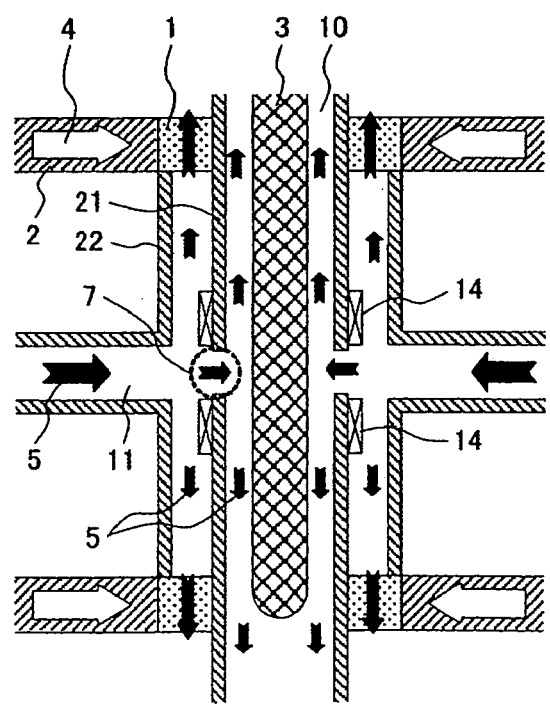
FIG. 6 is a schematic view of an NMR probe in accordance with an embodiment 4.

FIG. 6 is a schematic view showing a flow path and a heat flow intruding from a probe case in the case of circulating the temperature modulated gas in a probe in accordance with an embodiment 4. The flow of the temperature modulated gas 5 is not directly circulated to the sample pipe 3 at the first time, but is first circulated to the thermal anchor temperature modulated gas flow path 11 directly connected to the thermal anchor 1, as is different from the embodiment 1 mentioned above. Next, a part of the temperature modulated gas 5 flows toward the thermal anchor, the remaining part flows toward the sample pipe insertion port 10, and exchanges heat with the sample pipe 3. In FIG. 6, the temperature modulated gas flow division hole 7 is provided in the place which is closest to the probe coil 14 in the same manner as the embodiment 1, however, this position may be the same position as the embodiment 2.

In accordance with the embodiment 4, there is obtained an effect that the structure can be applied to a case that it is desired to spatially uniformize the temperature of the sample pipe 3, in the probe structure having a specification that the temperature modulated gas 5 can not be circulated to the sample pipe 3.

EMBODIMENT 5

Figure 7:
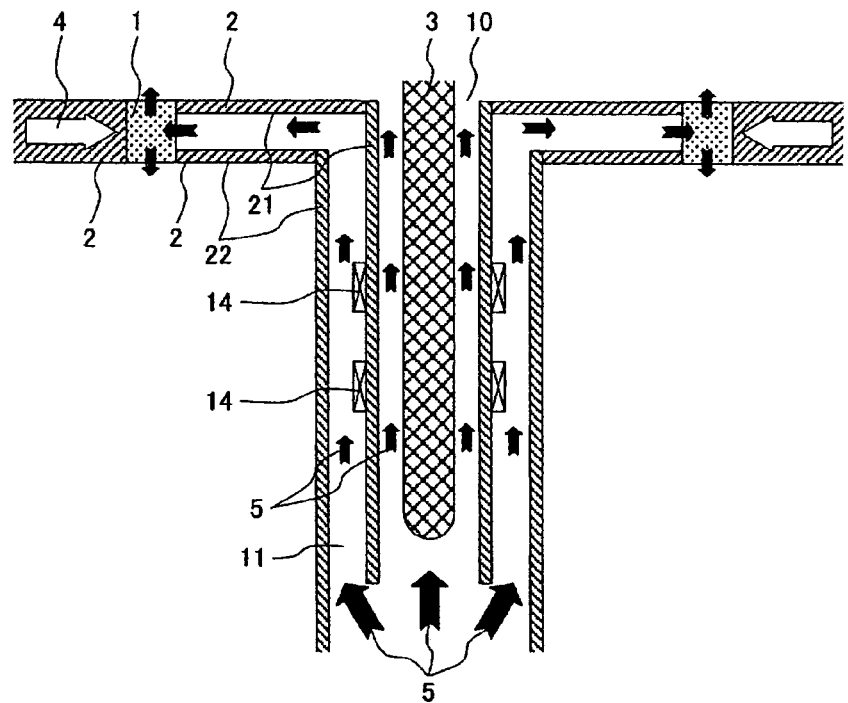
FIG. 7 is a schematic view of an NMR probe in accordance with an embodiment 5.

FIG. 7 is a schematic view showing a flow path and a heat flow intruding from a probe case in the case of circulating the temperature modulated gas in a probe in accordance with an embodiment 5. The embodiment is the same as the embodiment 1 in a point that the temperature modulated gas 5 first flows through the side surface of the sample pipe 3. A different point exists in a matter that the probe case 2 is provided with a flow path through which the temperature modulated gas 5 passes. Further, this embodiment is different from all the other embodiments described in the present specification in a point that the thermal anchor 1 exists in the probe case 2. The embodiment 5 can be applied to a case that it is desirable to arrange the thermal anchor 1 away from the sample pipe 3 or the probe coil 14. In this case, the temperature modulated gas 5 may be supplied, for example, in accordance with the manner of the embodiment 1 or 2.

EMBODIMENT 6

Figure 8:
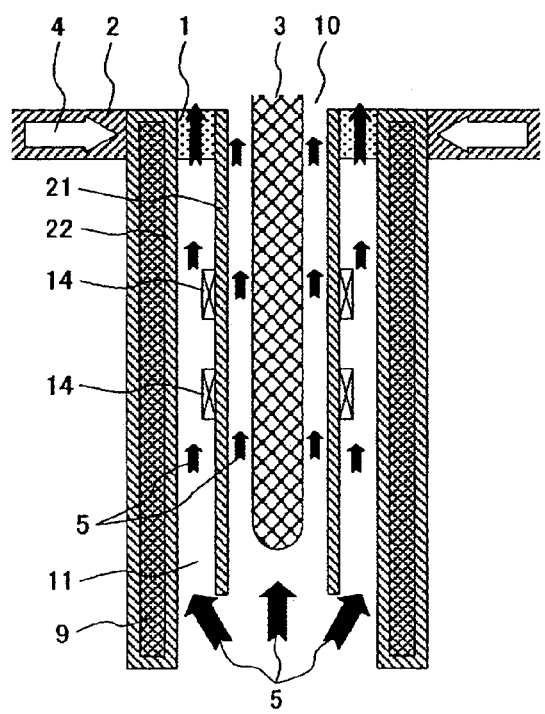
FIG. 8 is a schematic view of an NMR probe in accordance with an embodiment 6.

FIG. 8 is a schematic view showing a flow path and a heat flow intruding from a probe case in the case of circulating the temperature modulated gas in a probe in accordance with an embodiment 6. The embodiments 1 to 5 are applied to the NMR probe provided with no vacuum heat insulating layer, however, the embodiment 6 can be applied to a probe provided with a vacuum heat insulating layer 9. The temperature modulated gas 5 may be supplied, for example, in accordance with the manner of the embodiment 1 or 2.

In accordance with this embodiment, in order to reduce the heat flow 4 from the probe case, the heat intrusion is reduced by using the thermal anchor in addition to the arrangement of the vacuum heat insulating pipe.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An NMR probe comprising:
a probe case inserted to a bore portion of a superconducting magnet;
a sample pipe insertion port surrounded by the probe case and provided for inserting a sample pipe thereto;
a probe coil receiving a nuclear magnetic resonance (NMR) signal of a sample entering into the sample pipe, the probe coil being provided in an outer side near the center of the sample pipe insertion port; and
a temperature modulated gas for controlling a temperature of the sample pipe capable of being supplied to the sample pipe insertion port,
wherein a sample pipe insertion structure body constituted by a hollow portion and double pipes is provided in an inner side of the probe case, a flow division hole of the temperature modulated gas is formed in the sample pipe insertion structure body in such a manner as to place an inner and outer pipe of the double pipes in communication with the other, the sample pipe insertion port is formed by the hollow portion, the temperature modulated gas is supplied to a flow path between the double pipes, and the NMR probe is provided with a thermal anchor exchanging heat with the temperature modulated gas flowing through the flow path and connecting the probe case and the sample pipe insertion structure body.

2. An NMR probe as claimed in claim 1, wherein the thermal anchor is constituted by the porous metal or the porous ceramics.

3. An NMR probe as claimed in claim 1, wherein the flow division hole of the temperature modulated gas is provided in the sample pipe insertion structure body.

4. An NMR probe as claimed in claim 3, wherein the flow division hole is provided near a lower end of the sample pipe insertion port.

5. An NMR probe as claimed in claim 3, wherein the temperature modulated gas is supplied from a lower side of the sample pipe insertion port or the flow path side of the sample pipe insertion structure body.

6. An NMR probe as claimed in claim 1, wherein the temperature modulated gas is supplied from both of the lower side of the sample pipe insertion port and the flow path side of the sample pipe insertion structure body.

7. An NMR probe comprising:
a probe case inserted to a bore portion of a superconducting magnet;
a sample pipe insertion port surrounded by the probe case and provided for inserting a sample pipe thereto;
a probe coil receiving a nuclear magnetic resonance (NMR) signal of a sample entering into the sample pipe, the probe coil being provided in an outer side near the center of the sample pipe insertion port; and
a temperature modulated gas for controlling a temperature of the sample pipe capable of being supplied to the sample pipe insertion port,
wherein a sample pipe insertion structure body constituted by a hollow portion and double pipes is provided in an inner side of the probe case, a flow division hole of the temperature modulated gas is formed in the sample pipe insertion structure body in such a manner as to place an inner and outer pipe of the double pipes in communication with the other, the sample pipe insertion port is formed by the hollow portion, the temperature modulated gas is supplied to a flow path between the double pipes, the NMR probe is provided with a thermal anchor exchanging heat with the temperature modulated gas flowing through the flow path and connecting the probe case and the sample pipe insertion structure body, and a connecting portion in which the thermal anchor is installed is provided in the probe case side.

8. An NMR probe comprising:
a probe case inserted to a bore portion of a superconducting magnet;
a sample pipe insertion port surrounded by the probe case and provided for inserting a sample pipe thereto;
a probe coil receiving a nuclear magnetic resonance (NMR) signal of a sample entering into the sample pipe, the probe coil being provided in an outer side near the center of the sample pipe insertion port; and
a temperature modulated gas for controlling a temperature of the sample pipe capable of being supplied to the sample pipe insertion port,
wherein a sample pipe insertion structure body is provided in such a manner as to have a hollow portion and double pipes in an inner side of the probe case and have a vacuum heat insulating layer in an outer side of the double pipes, a flow division hole of the temperature modulated gas is formed in the sample pipe insertion structure body in such a manner as to place an inner and outer pipe of the double pipes in communication with the other the sample pipe insertion port is formed by the hollow portion, the temperature modulated gas is supplied to a flow path between the double pipes, and the NMR probe is provided with a thermal anchor exchanging heat with the temperature modulated gas flowing through the flow path and connecting the probe case and the sample pipe insertion structure body.

* * * * *